(12) United States Patent
Chuang

(10) Patent No.: US 12,431,456 B2
(45) Date of Patent: Sep. 30, 2025

(54) PACKAGE STRUCTURE INCLUDING A FIRST NON-CONDUCTIVE LAYER HAVING A GREATER MELT VISCOSITY THAN A SECOND NON-CONDUCTIVE LAYER AND METHOD FOR FABRICATING THE PACKAGE STRUCTURE

(71) Applicant: CHANGXIN MEMORY TECHNOLOGIES, INC., Hefei (CN)

(72) Inventor: Ling-Yi Chuang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 490 days.

(21) Appl. No.: 17/953,272

(22) Filed: Sep. 26, 2022

(65) Prior Publication Data

US 2023/0017846 A1   Jan. 19, 2023

Related U.S. Application Data

(63) Continuation of application No. PCT/CN2022/076451, filed on Feb. 16, 2022.

(30) Foreign Application Priority Data

Jul. 12, 2021   (CN) .......................... 202110786040.3

(51) Int. Cl.
   *H01L 23/00*   (2006.01)
   *H01L 21/311*   (2006.01)
   (Continued)

(52) U.S. Cl.
   CPC ........ *H01L 24/32* (2013.01); *H01L 21/31133* (2013.01); *H01L 21/563* (2013.01);
   (Continued)

(58) Field of Classification Search
   CPC ....... H01L 24/32; H01L 24/81; H01L 21/563; H01L 23/3121; H01L 23/3135;
   (Continued)

(56) References Cited

U.S. PATENT DOCUMENTS 6,774,497 B1 * 8/2004 Qi ........................... H01L 24/29
                                                      257/E21.503
8,298,874 B2 * 10/2012 Gallegos ........... H01L 23/49816
                                                      438/108

(Continued)

FOREIGN PATENT DOCUMENTS

| CN | 105206587 A | 12/2015 |
| CN | 111433907 A | 7/2020 |
| JP | 2014022405 A | 2/2014 |

OTHER PUBLICATIONS

JP-2014022405-A, Machine English Translation, Circuit Connection Member, Circuit Connection Method and Circuit Connection Structure Using the Same, Feb. 3, 2014. (Year: 2014).*

*Primary Examiner* — Khiem D Nguyen
(74) *Attorney, Agent, or Firm* — Kilpatrick Townsend & Stockton LLP

(57) ABSTRACT

Embodiments disclose a package structure and a fabricating method. The package structure includes: a semiconductor chip; a first non-conductive layer covering a front surface of the semiconductor chip and part of a side wall of the semiconductor chip; a second non-conductive layer positioned on an upper surface of the first non-conductive layer and covering at least part of a side wall of the first non-conductive layer, wherein a melt viscosity of the first non-conductive layer is greater than a melt viscosity of the second non-conductive layer; a substrate; and a solder mask layer positioned on a surface of the substrate, where a first opening is provided in the solder mask layer. The semiconductor chip is flip-chip bonded on the substrate, a surface of (Continued)

the second non-conductive layer away from the first non-conductive layer and a surface of the solder mask layer away from the substrate are bonding surfaces.

16 Claims, 5 Drawing Sheets

(51) Int. Cl.
 H01L 21/56 (2006.01)
 H01L 23/31 (2006.01)
(52) U.S. Cl.
 CPC .......... *H01L 23/3135* (2013.01); *H01L 24/16* (2013.01); *H01L 24/29* (2013.01); *H01L 24/73* (2013.01); *H01L 24/83* (2013.01); *H01L 21/565* (2013.01); *H01L 24/81* (2013.01); *H01L 2224/16258* (2013.01); *H01L 2224/29005* (2013.01); *H01L 2224/29019* (2013.01); *H01L 2224/29076* (2013.01); *H01L 2224/29082* (2013.01); *H01L 2224/2919* (2013.01); *H01L 2224/32245* (2013.01); *H01L 2224/73204* (2013.01); *H01L 2224/81815* (2013.01); *H01L 2224/83203* (2013.01); *H01L 2924/1436* (2013.01); *H01L 2924/1815* (2013.01); *H01L 2924/182* (2013.01); *H01L 2924/3841* (2013.01)

(58) Field of Classification Search
 CPC ....... H01L 23/3192; H01L 2224/16258; H01L 2224/29092; H01L 2224/83203; H01L 2224/29082
 See application file for complete search history.

(56) References Cited

U.S. PATENT DOCUMENTS

| 2002/0031868 | A1  | 3/2002  | Capote et al. |                |
|--------------|-----|---------|---------------|----------------|
| 2003/0183947 | A1  | 10/2003 | Riekaohuchi   |                |
| 2006/0030075 | A1* | 2/2006  | Sugiyama      | H01L 24/29     |
|              |     |         |               | 257/E21.503    |
| 2014/0346673 | A1* | 11/2014 | Lin           | H01L 21/563    |
|              |     |         |               | 257/737        |
| 2015/0140738 | A1* | 5/2015  | Moriyama      | H01L 24/83     |
|              |     |         |               | 403/272        |
| 2015/0147851 | A1* | 5/2015  | Feger         | H01L 24/92     |
|              |     |         |               | 438/126        |
| 2015/0255349 | A1* | 9/2015  | Holden        | H01J 37/32009  |
|              |     |         |               | 156/345.1      |
| 2019/0157111 | A1* | 5/2019  | Luo           | H01L 24/29     |

* cited by examiner

PACKAGE STRUCTURE INCLUDING A FIRST NON-CONDUCTIVE LAYER HAVING A GREATER MELT VISCOSITY THAN A SECOND NON-CONDUCTIVE LAYER AND METHOD FOR FABRICATING THE PACKAGE STRUCTURE

CROSS-REFERENCE TO RELATED APPLICATION

The present disclosure is a continuation of PCT/CN2022/076451, filed on Feb. 16, 2022, which claims priority to Chinese Patent Application No. 202110786040.3 titled "PACKAGE STRUCTURE AND METHOD FOR FABRICATING SAME" and filed to the State Intellectual Property Office on, Jul. 12, 2021, the entire contents of which are incorporated herein by reference.

TECHNICAL FIELD

The present disclosure relates to the field of semiconductor manufacturing technology, and more particularly, to a package structure and a method for fabricating the same.

BACKGROUND

As semiconductor storage technologies rapidly develop, higher requirements for storage capacities and chip package of semiconductor storage products are put forward in the market. For a dynamic random access memory (DRAM), after fabrication of a DRAM chip is completed, the DRAM chip needs to be packaged to improve durability.

However, in a traditional package structure, a non-conductive film layer covers the chip, the chip with the non-conductive film layer is bonded to a substrate by means of a thermal compress bonding (TCB) process, and the non-conductive film layer is filled in an opening region between the chip and the substrate. However, due to susceptibility to process conditions, part of air stays in the opening region, such that holes appear in the package structure, which leads to a quality problem in a solder bridge formed after reflow soldering is subsequently carried out.

SUMMARY

On this basis, it is necessary to provide a package structure and a method for fabricating the same.

To solve the above-mentioned technical problems, a first aspect of the present disclosure proposes a package structure, including: a semiconductor chip; a first non-conductive layer covering a front surface of the semiconductor chip and part of a side wall of the semiconductor chip; a second non-conductive layer positioned on an upper surface of the first non-conductive layer and covering at least part of a side wall of the first non-conductive layer, wherein a melt viscosity of the first non-conductive layer is greater than a melt viscosity of the second non-conductive layer; a substrate; a solder mask layer positioned on a surface of the substrate, wherein a first opening is provided in the solder mask layer; wherein the semiconductor chip is flip-chip bonded on the substrate, a surface of the second non-conductive layer away from the first non-conductive layer and a surface of the solder mask layer away from the substrate are bonding surfaces; and the second non-conductive layer fills up the first opening without voids.

A second aspect of the present disclosure provides a method for fabricating a package structure, including: providing a semiconductor chip; forming a first non-conductive layer on a front surface of the semiconductor chip; forming a second non-conductive layer on an upper surface of the first non-conductive layer, wherein a melt viscosity of the first non-conductive layer is greater than a melt viscosity of the second non-conductive layer; providing a substrate, wherein a solder mask layer is formed on a surface of the substrate, and a first opening is formed in the solder mask layer; and flip-chip bonding the semiconductor chip on the substrate, wherein a surface of the second non-conductive layer away from the first non-conductive layer and a surface of the solder mask layer away from the substrate are bonding surfaces; and the second non-conductive layer fills up the first opening without voids.

The above description is merely an overview of the technical solutions of the present disclosure, in order that the technical means of the present disclosure can be more clearly understood and they may be embodied according the content of the specification, the technical solutions of the present disclosure will be described in detail below with reference to some embodiments of the present disclosure and accompanying drawings.

BRIEF DESCRIPTION OF THE DRAWINGS

To describe the technical solutions of the embodiments of the present disclosure more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

Figure 1:
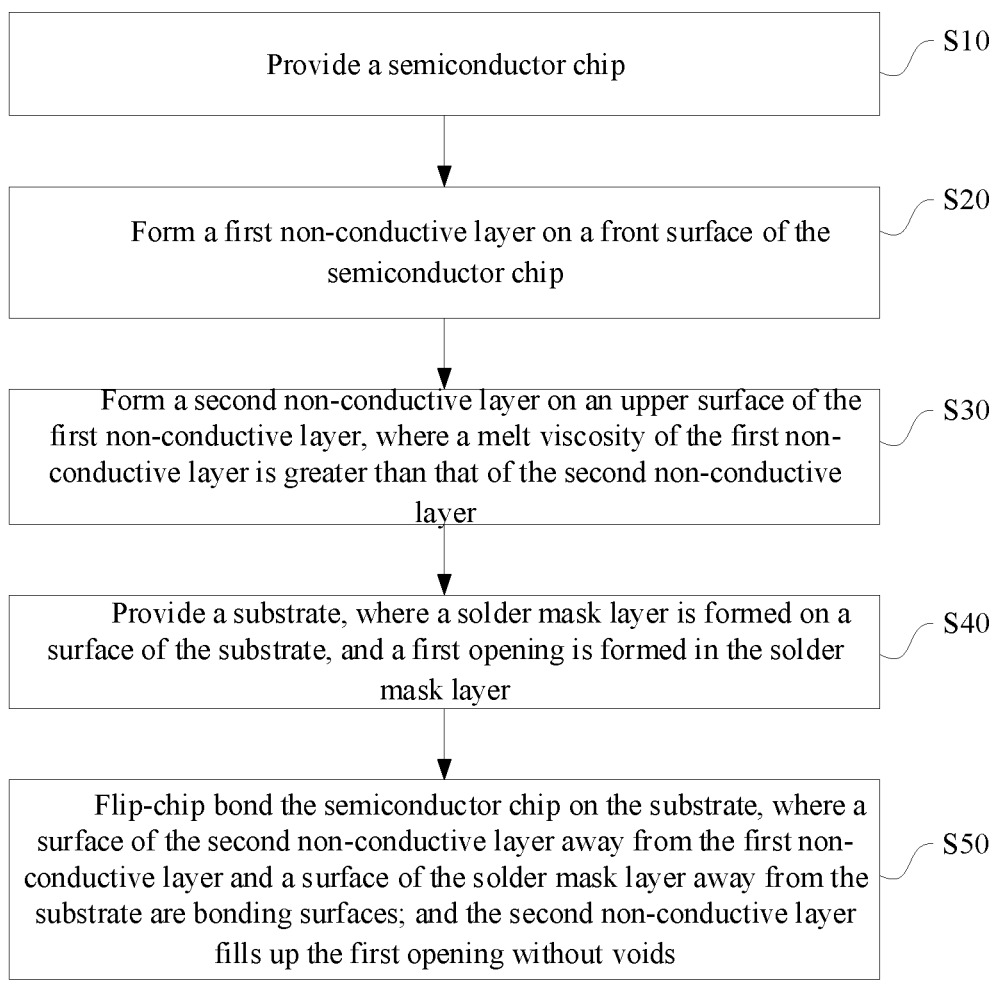
FIG. 1 is a schematic flowchart of a method for fabricating a package structure according to an embodiment of the present disclosure.

Reference numerals in the accompanying drawings: 10—semiconductor chip, 11—chip body, 111—circuit structure, 12—device structure, 121—second opening, 13—first dielectric layer, 131—first dielectric material layer, 14—second dielectric layer, 141—second dielectric material layer; 15—metal bump, 151—metal pillar, 152—solder ball; 21—first non-conductive layer, 22—second non-conductive layer; 23—substrate, 24—pad, 25—solder mask layer, 251—solder mask material layer, 26—first opening; and 27—molding layer.

DETAILED DESCRIPTION

For ease of understanding the present disclosure, the present disclosure will be described more fully hereinafter with reference to the accompanying drawings. Some embodiments of the present disclosure are provided in the accompanying drawings. The present disclosure may, however, be embodied in many different forms and should not be limited to the embodiments set forth herein. Rather, these embodiments are provided such that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure. As used herein, the term "and/or" includes any and all combinations of one or more of the associated listed items.

It should be understood that when an element or layer is referred to as being "on", "adjacent to", "connected to" or "coupled to" other elements or layers, it may be directly on, adjacent to, connected or coupled to the other elements or layers, or intervening elements or layers may be present. In contrast, when an element is referred to as being "directly on", "directly adjacent to", "directly connected to" or "directly coupled to" other elements or layers, there are no intervening elements or layers present. It should be understood that although the terms first, second, third, etc. may be employed to describe various elements, components, regions, layers and/or sections, these elements, components, regions, layers and/or sections should not be limited by these terms. These terms are only employed to distinguish one element, component, region, layer or section from another element, component, region, layer or section. Therefore, without departing from the teachings of the present disclosure, a first element, component, region, layer or section discussed below may be represented as a second element, component, region, layer or section.

Spatially relative terms such as "below", "under", "lower", "beneath", "above", "upper" and the like may be used herein for ease of description to describe relationships between one element or feature as shown in the figures and another element(s) or feature(s). It should be understood that the spatially relative terms may be intended to encompass different orientations of the device in use or operation in addition to the orientation depicted in the figures. For example, if the device in the figures is turned over, elements or features described as "under", "beneath" or "below" other elements would then be oriented "above" the other elements or features. Thus, the exemplary term "under", "below" or "beneath" may encompass both an orientation of above and below. The device may be otherwise oriented (rotated 90 degrees or at other orientations) and the spatially relative descriptors used herein should be interpreted accordingly.

The terminology used herein is for the purpose of describing some embodiments only and is not intended to limit the present disclosure. As used herein, the singular forms of "a", "one" and "said/the" are also intended to include plural forms, unless the context clearly indicates otherwise. It should also be understood that the terms "comprising" and/or "including", when used in this specification, determine the presence of the described features, integers, steps, operations, elements and/or components, but do not preclude the presence or addition of one or more other features, integers, steps, operations, elements, components, and/or groups thereof. As used herein, the term "and/or" includes any and all combinations of related listed items.

Embodiments of the present disclosure are described herein with reference to cross-sectional illustrations serving as schematic illustrations of idealized embodiments (and intermediate structures) of the present disclosure. As such, variations from the shapes of the illustrations as a result, for example, of manufacturing techniques and/or tolerances, may be expected. Thus, embodiments of the present disclosure should not be construed as being limited to particular shapes of regions illustrated herein but may include deviations in shapes that result, for example, from manufacturing. Thus, regions illustrated in the figures are schematic in nature and their shapes do not necessarily illustrate the actual shape of a region of a device and do not limit the scope of the present disclosure.

In one embodiment of the present disclosure, as shown in FIG. 1, a method for fabricating a package structure is provided, which includes following steps: Step S10: providing a semiconductor chip; Step S20: forming a first non-conductive layer on a front surface of the semiconductor chip; Step S30: forming a second non-conductive layer on an upper surface of the first non-conductive layer, where a melt viscosity of the first non-conductive layer is greater than that of the second non-conductive layer; Step S40: providing a substrate, where a solder mask layer is formed on a surface of the substrate, and a first opening is formed in the solder mask layer; and Step S50: flip-chip bonding the semiconductor chip on the substrate, where a surface of the second non-conductive layer away from the first non-conductive layer and a surface of the solder mask layer away from the substrate are bonding surfaces; and the second non-conductive layer fills up the first opening without voids.

In the package structure provided by the above embodiment, the semiconductor chip is provided; the first non-conductive layer is formed on the front surface of the semiconductor chip; the second non-conductive layer is formed on an upper surface of the first non-conductive layer, where the melt viscosity of the first non-conductive layer is greater than that of the second non-conductive layer; a substrate is provided, where a solder mask layer is formed on the surface of the substrate, and the first opening is formed in the solder mask layer; and the semiconductor chip is flip-chip bonded on the substrate, where the surface of the second non-conductive layer away from the first non-conductive layer and the surface of the solder mask layer away from the substrate are bonding surfaces; and the second non-conductive layer fills up the first opening without voids. For the two non-conductive film layers with different melt viscosities, the second non-conductive layer with lower melt viscosity at a lower layer covers the first non-conductive layer, and the second non-conductive layer has better fluidity, and is easy to fill up the first opening, such that air is discharged out of the package structure to eliminate a hole. The first non-conductive layer with higher melt viscosity covers the semiconductor chip and pulls the second non-conductive layer to suppress overflow of the second non-conductive layer. In this way, it is ensured that the overflow of the second non-conductive layer out of the semiconductor chip due to higher fluidity is under control, thereby preventing reoccurrence of the hole in the package structure, such that quality and reliability of the package structure can be improved.

Figure 2:
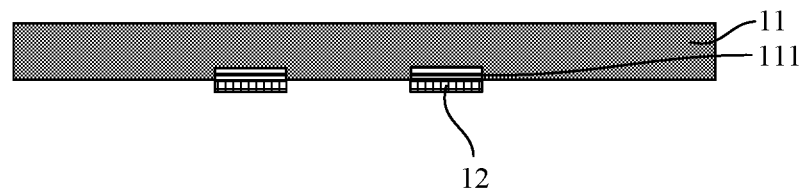
FIG. 2 is a schematic partial cross-sectional view of a structure obtained after a chip body on which a device structure is formed is provided in the method for fabricating the package structure according to an embodiment of the present disclosure.
Figure 3:
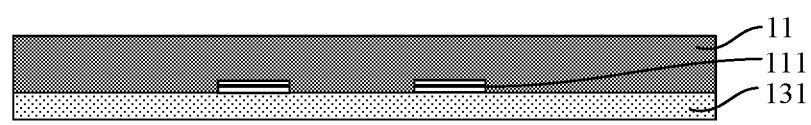
FIG. 3 is a schematic partial cross-sectional view of a structure obtained after a first dielectric material layer is formed in the method for fabricating the package structure according to an embodiment of the present disclosure.
Figure 4:
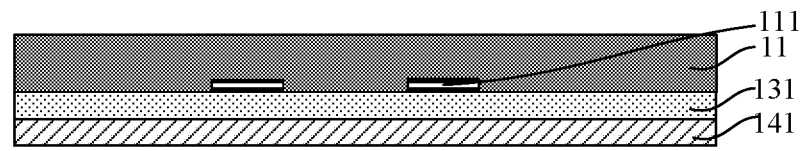
FIG. 4 is a schematic partial cross-sectional view of a structure obtained after a second dielectric material layer is formed in the method for fabricating the package structure according to an embodiment of the present disclosure.
Figure 5:
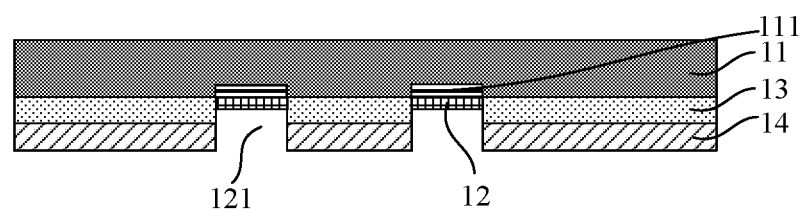
FIG. 5 is a schematic partial cross-sectional view of a structure obtained after a second opening is formed to expose the device structure in the method for fabricating the package structure according to an embodiment of the present disclosure.
Figure 6:
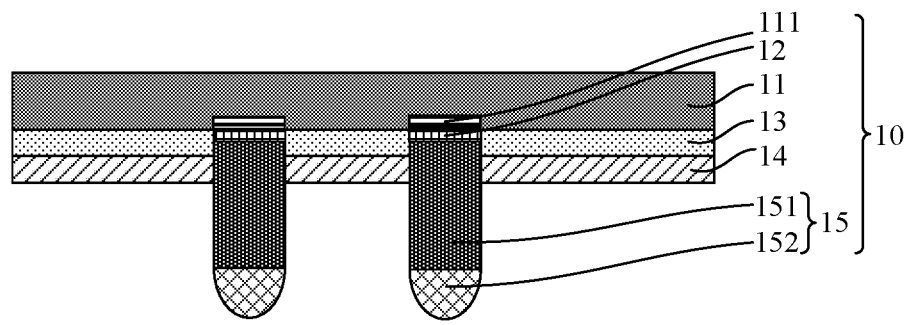
FIG. 6 is a schematic partial cross-sectional view of a structure obtained after a metal bump is formed in the method for fabricating the package structure according to an embodiment of the present disclosure.

In one embodiment, providing the semiconductor chip in Step S10 includes following steps: Step S11: providing a chip body 11, where a device structure 12 is formed on a front surface of the chip body 11, the chip body 11 includes a circuit structure 111, and the circuit structure 111 is electrically connected to the device structure 12, as shown in FIG. 2; Step S12: forming a first dielectric layer 13 and a second dielectric layer 14 in sequence on the front surface of the chip body 11, as shown in FIG. 3 and FIG. 4, where a second opening 121 is formed in the first dielectric layer 13 and the second dielectric layer 14, and the second opening 121 exposes the device structure 12, as shown in FIG. 5; and Step S13: forming a metal bump 15 on the device structure 12 formed on the front side of the chip body 11, where the metal bump 15 is electrically connected to the device structure 12, as shown in FIG. 6.

In one embodiment, there may be a plurality of device structures 12 formed on the front surface of each chip body 11, and the device structures 12 and the metal bumps 15 are arranged in one-to-one correspondence. The metal bump 15 includes a metal pillar 151 and a solder ball 152. The metal pillar 151 is electrically connected to the device structure 12, and the solder ball 152 is positioned on an upper surface of the metal pillar 151. As an example, a material of the metal pillar 151 may include, but is not limited to, copper, tungsten, tin, or an alloy formed by any combination of these metal, etc. A material of the solder ball 152 may include, but is not limited to, copper, tungsten, tin, or an alloy formed by any combination of these metal, etc.

In one embodiment, the Step S12 of forming the first dielectric layer 13 and the second dielectric layer 14 in sequence on the front surface of the chip body 11 includes following steps: Step S121: forming a first dielectric material layer 131 on the front surface of the chip body 11, as shown in FIG. 3; Step S122: forming a second dielectric material layer 141 on a surface of the first dielectric material layer 131 away from the front surface of the chip body 11, as shown in FIG. 4; and Step S123: patterning the first dielectric material layer 131 and the second dielectric material layer 141, and removing part of the first dielectric material layer 131 and part of the second dielectric material layer 141 to obtain the first dielectric layer 13 and the second dielectric layer 14, where regions corresponding to the removed part of the first dielectric material layer 131 and the removed part of the second dielectric material layer 141 are the second openings 121, as shown in FIG. 5.

As an example, a material of the first dielectric layer 13 may include, but is not limited to, silicon oxide or silicon nitride, etc. A material of the second dielectric layer 14 may include, but is not limited to, silicon oxide or silicon nitride, etc. The material of the first dielectric layer 13 and the material of the second dielectric layer 14 may be the same or may be different.

Figure 7:
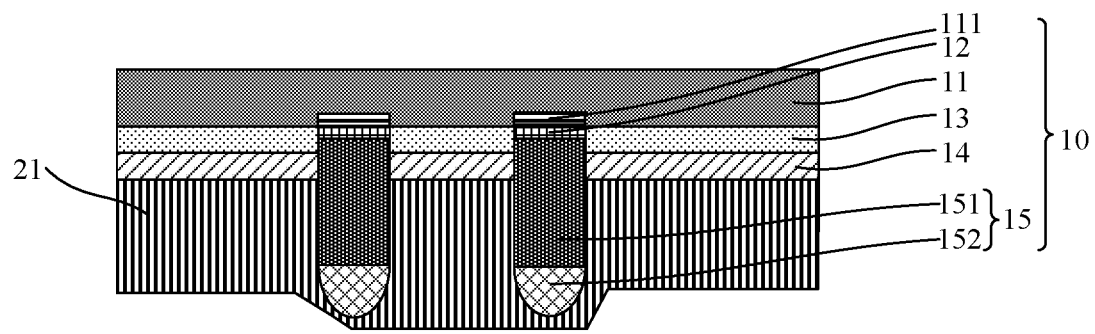
FIG. 7 is a schematic partial cross-sectional view of a structure obtained after a first non-conductive layer is formed in the method for fabricating the package structure according to an embodiment of the present disclosure.
Figure 8:
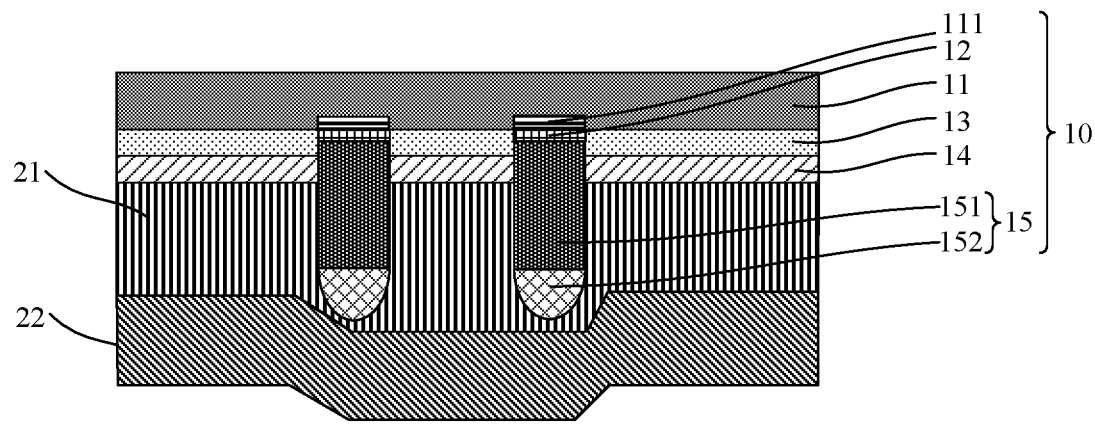
FIG. 8 is a schematic partial cross-sectional view of a structure obtained after a second non-conductive layer is formed in the method for fabricating the package structure according to an embodiment of the present disclosure.

In one embodiment, as shown in FIG. 7 and FIG. 8, in Step S20, the first non-conductive layer 21 covers the front surface of the semiconductor chip 10 and wraps the solder ball 152. The second non-conductive layer 22 formed in Step S30 covers the upper surface of the first non-conductive layer 21, but does not cover a side wall of the semiconductor chip 10. When the semiconductor chip 10 operates, the chip body 11 may generate heat. If the second non-conductive layer 22 covers the side wall of the semiconductor chip 10, the heat generated by the chip body 11 may accelerate fluidity of the second non-conductive layer 22, such that the voids appear in the substrate 23 again.

In one embodiment, the melt viscosity of the first non-conductive layer is 2,000 Pa·s to 3,000 Pa·s, and the melt viscosity of the second non-conductive layer is less than or equal to 1,000 Pa·s. In some embodiments, the melt viscosity of the first non-conductive layer is 2000 Pa·s, 2100 Pa·s, 2200 Pa·s, 2300 Pa·s, 2400 Pa·s, 2500 Pa·s, 2600 Pa·s, 2700 Pa·s, 2800 Pa·s, 2900 Pa·s, or 3000 Pa·s, etc. The melt viscosity of the second non-conductive layer is 100 Pa·s, 200 Pa·s, 300 Pa·s, 400 Pa·s, 500 Pa·s, 600 Pa·s, 700 Pa·s, 800 Pa·s, 900 Pa·s, or 1000 Pa·s, etc. A material of the first non-conductive layer 21 and a material of the second non-conductive layer 22 are both viscous adhesives. The material of the first non-conductive layer 21 and the material of the second non-conductive layer 22 are not limited as long as the first non-conductive layer 21 has a higher melt viscosity and the second non-conductive layer 22 has a lower melt viscosity.

Figure 9:
FIG. 9 is a schematic partial cross-sectional view of a structure obtained after a substrate is provided in the method for fabricating the package structure according to an embodiment of the present disclosure.

In one embodiment, as shown in FIG. 9, the substrate 23 provided in Step S40 may include, but is not limited to, a silicon substrate. A pad 24 is formed on the surface of the substrate 23.

Figure 10:
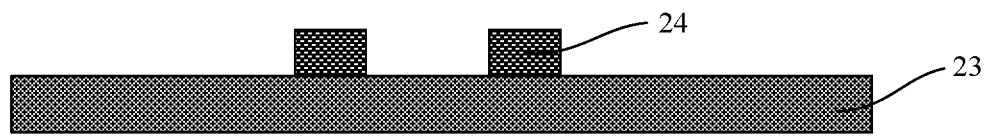
FIG. 10 is a schematic partial cross-sectional view of a structure obtained after a pad is formed in the method for fabricating the package structure according to an embodiment of the present disclosure.
Figure 11:
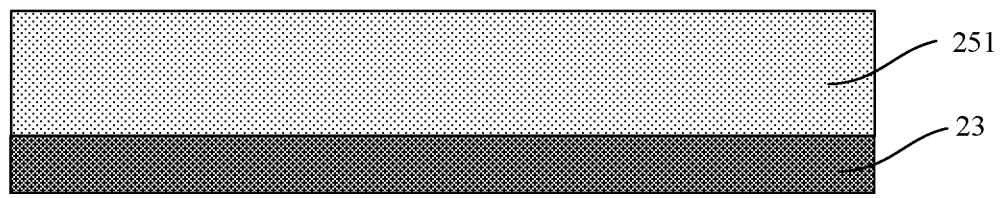
FIG. 11 is a schematic partial cross-sectional view of a structure obtained after a solder mask material layer is formed in the method for fabricating the package structure according to an embodiment of the present disclosure.
Figure 12:
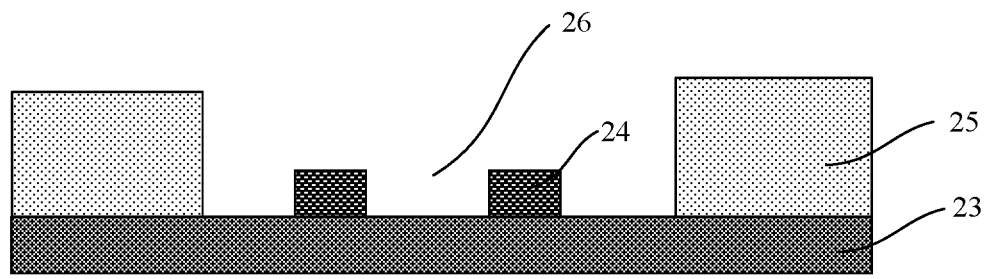
FIG. 12 is a schematic partial cross-sectional view of a structure obtained after a solder mask layer and a first opening are formed in the method for fabricating the package structure according to an embodiment of the present disclosure.

The Step S40 of providing the substrate 23 includes following steps: Step S41: forming the pad 24 on the surface of the substrate 23, as shown in FIG. 10; Step S42: forming a solder mask material layer 251 on the surface of the substrate 23 and on the pad 24, where the solder mask material layer 251 covers the pad 24, as shown in FIG. 11; and Step S43: patterning the solder mask material layer 251, and removing part of the solder mask material layer 251 to obtain a solder mask layer 25, where a region corresponding to the removed part of the solder mask material layer 251 is the first opening 26, and the first opening 26 exposes the pad 24, as shown in FIG. 12.

In some embodiments, a part of the solder mask material layer 251 positioned on the surface of the substrate 23 is removed by means of a wet etching process.

In one embodiment, a thickness of the second non-conductive layer 22 is less than or equal to that of the solder mask layer 25. After the semiconductor chip 10 is flip-chip bonded on the substrate 23 subsequently, the second non-conductive layer 22 whose thickness is less than or equal to that of the solder mask layer 25 may fill up the first opening 26, while overflow of the material of the second non-conductive layer is reduced. A material of the solder mask layer 25 includes a solder mask. There may be a plurality of pads 24, and the plurality of pads 24 and the plurality of metal bumps 15 are arranged in one-to-one correspondence.

Figure 13:
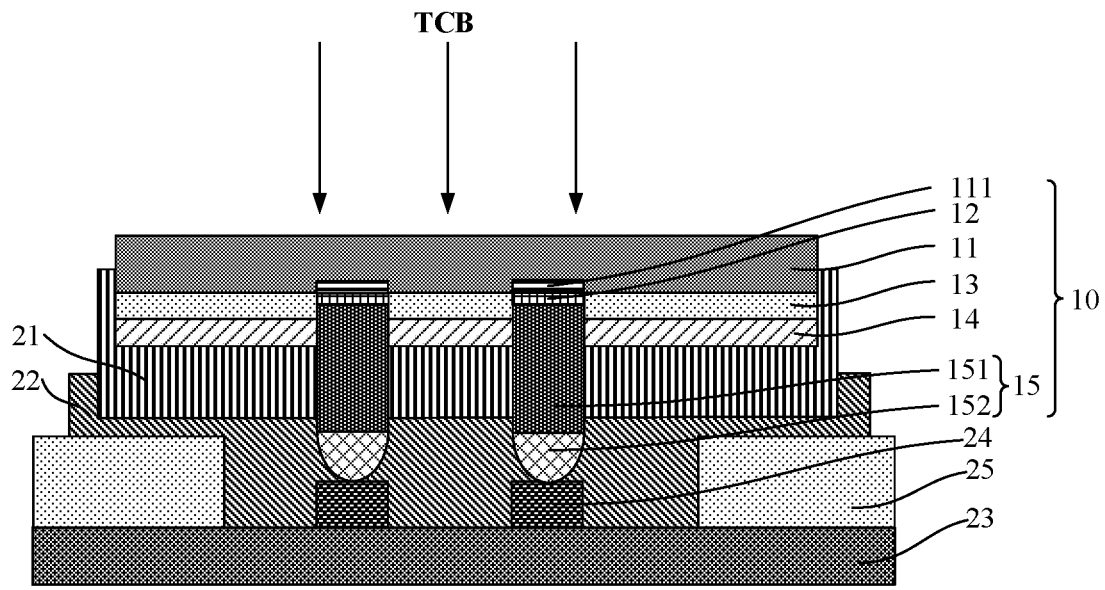
FIG. 13 is a schematic partial cross-sectional view of a structure obtained after a semiconductor chip is flip-chip bonded on the substrate in the method for fabricating the package structure according to an embodiment of the present disclosure.

In one embodiment, Step S50: flip-chip bonding the semiconductor chip 10 on the substrate 23, where a structure obtained after the second non-conductive layer 22 fills up the first opening 26 without voids is shown in FIG. 13. The pad 24 comes into contact with the metal bump 15, that is, the solder ball 152 comes into contact with the pad 24. The first non-conductive layer 21 covers part of a side wall of the semiconductor chip 10 and covers part of a side wall of the chip body 11. Part of the first non-conductive layer 22 covering the side wall of the chip body 11 at least exceeds an interface range of the circuit structure 111 in the chip body 11, to better protect the semiconductor chip 10. The second non-conductive layer 22 fills up the first opening 26 without voids, and covers at least part of the side wall of the first non-conductive layer 22.

In some embodiments, the semiconductor chip 10 is flip-chip bonded to the substrate 23 by means of thermal compress bonding (TCB). Before the Step S50 of flip-chip bonding the semiconductor chip 10 on the substrate 23, the method further includes: Step S401: preheating the substrate 23, where a preheating temperature is 130° C. to 200° C., and air in the region of the first opening 26 is discharged based on the characteristic of lower melt viscosity of the second non-conductive layer 22. In some embodiments, the preheating temperature is 130° C., 140° C., 150° C., 160° C., 170° C., 180° C., 190° C., or 200° C., etc. After the air is completely removed, the TCB treatment is performed. Within a first preset temperature range, the second non-conductive layer 22 flows and the first non-conductive layer 21 solidifies. Within the second preset temperature range, the second non-conductive layer 22 solidifies and flows, and the first non-conductive layer 21 begins to flow.

Figure 14:
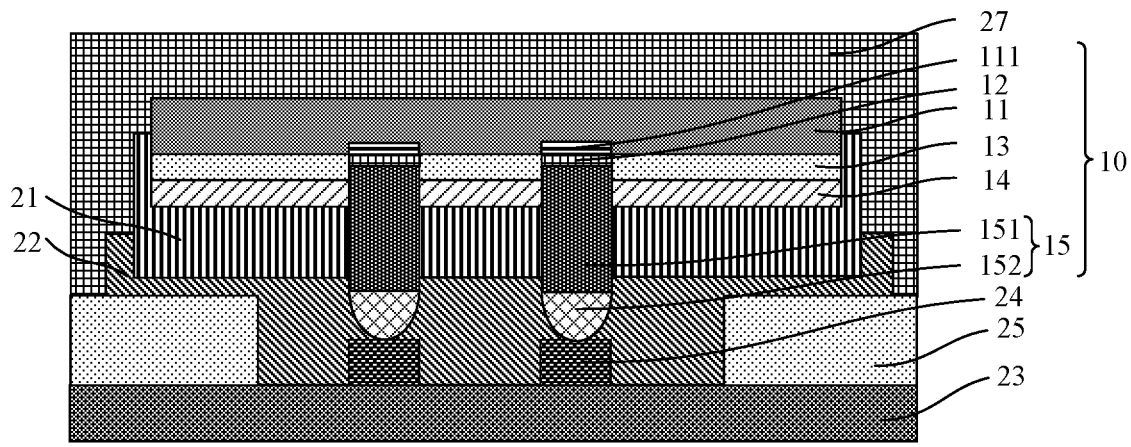
FIG. 14 is a schematic partial cross-sectional view of a structure obtained after a molding layer is formed in the method for fabricating the package structure according to an embodiment of the present disclosure.

In one embodiment, in Step S50, the semiconductor chip 10 is flip-chip bonded on the substrate 23, where the surface of the second non-conductive layer 22 away from the first non-conductive layer 21 and the surface of the solder mask layer 25 away from the substrate 23 are bonding surfaces, and after the second non-conductive layer 22 fills up the first opening 26 without voids, the method further includes: Step S60: forming a molding layer 27 on the upper surface of the solder mask layer 25, where the molding layer 27 wraps the semiconductor chip 10, the first non-conductive layer 21, and the second non-conductive layer 22, as shown in FIG. 14. A side wall of the first dielectric layer 13 and a side wall of the second dielectric layer 14 are completely covered by the first non-conductive layer 21 without coming into direct contact with the molding layer 27, and thus there is no reliability problem caused by an excessive difference between expansion coefficients.

In one embodiment of the present disclosure, there is also proposed a package structure, including: the semiconductor chip 10; the first non-conductive layer 21 covering the front surface of the semiconductor chip 10 and part of the side wall of the semiconductor chip 10; the second non-conductive layer 22 positioned on the upper surface of the first non-conductive layer 21 and covering at least part of the side wall of the first non-conductive layer 21, where the melt viscosity of the first non-conductive layer 21 is greater than that of the second non-conductive layer 22; the substrate 23; and the solder mask layer 25 positioned on the surface of the substrate 23, where the first opening 26 is provided in the solder mask layer 25. The semiconductor chip 10 is flip-chip bonded on the substrate 23, the surface of the second non-conductive layer 22 away from the first non-conductive layer 21 and the surface of the solder mask layer 25 away from the substrate 23 are bonding surfaces, and the second non-conductive layer 22 fills up the first opening 26 without voids.

The package structure provided by the above embodiments includes: the semiconductor chip; the first non-conductive layer covering the front surface of the semiconductor chip and part of the side wall of the semiconductor chip; the second non-conductive layer positioned on the upper surface of the first non-conductive layer and covering at least part of the side wall of the first non-conductive layer, where the melt viscosity of the first non-conductive layer is greater than that of the second non-conductive layer; the substrate; and the solder mask layer positioned on the surface of the substrate, where the first opening is provided in the solder mask layer. The semiconductor chip is flip-chip bonded on the substrate, the surface of the second non-conductive layer away from the first non-conductive layer and the surface of the solder mask layer away from the substrate are bonding surfaces, and the second non-conductive layer fills up the first opening without voids. For the two non-conductive film layers with different melt viscosities, the second non-conductive layer with lower melt viscosity at a lower layer covers the first non-conductive layer, and the second non-conductive layer has better fluidity, and thus it is easy to fill up the first opening, such that air is discharged out of the package structure to eliminate a hole. The first non-conductive layer with higher melt viscosity covers the semiconductor chip and pulls the second non-conductive layer to suppress overflow of the second non-conductive layer. In this way, it is ensured that the overflow of the second non-conductive layer out of the semiconductor chip due to higher fluidity is under control, thereby preventing reoccurrence of the hole in the package structure, such that quality and reliability of the package structure can be improved.

In one embodiment, the melt viscosity of the first non-conductive layer 21 is 2,000 Pa·s to 3,000 Pa·s, and the melt viscosity of the second non-conductive layer 22 is less than or equal to 1,000 Pa·s. In some embodiments, the melt viscosity of the first non-conductive layer 21 is 2000 Pa·s, 2100 Pa·s, 2200 Pa·s, 2300 Pa·s, 2400 Pa·s, 2500 Pa·s, 2600 Pa·s, 2700 Pa·s, 2800 Pa·s, 2900 Pa·s, or 3000 Pa·s, etc. The melt viscosity of the second non-conductive layer 22 is 100 Pa·s, 200 Pa·s, 300 Pa·s, 400 Pa·s, 500 Pa·s, 600 Pa·s, 700 Pa·s, 800 Pa·s, 900 Pa·s, or 1000 Pa·s, etc. A material of the first non-conductive layer 21 and a material of the second non-conductive layer 22 are both viscous adhesives. The material of the first non-conductive layer 21 and the material of the second non-conductive layer 22 are not limited as long as the first non-conductive layer 21 has a higher melt viscosity and the second non-conductive layer 22 has a lower melt viscosity.

In one embodiment, the semiconductor chip 10 includes a chip body 11, a first dielectric layer 13, a second dielectric layer 14, and a metal bump 15. The chip body 11, the first dielectric layer 13, and the second dielectric layer 14 are stacked in sequence. A device structure 12 is formed on the front surface of the chip body 11, and a second opening 121 is provided in the first dielectric layer 13 and the second dielectric layer 14, where the second opening 121 exposes the device structure 12. The metal bump 15 is electrically connected to the device structure 12; and the first non-conductive layer 21 is positioned on a surface of the second dielectric layer 14.

As an example, a material of the first dielectric layer 13 may include, but is not limited to, silicon oxide or silicon nitride, etc. A material of the second dielectric layer 14 may include, but is not limited to, silicon oxide or silicon nitride, etc. The material of the first dielectric layer 13 and the material of the second dielectric layer 14 may be the same or may be different.

In one embodiment, the metal bump 15 includes a metal pillar 151 and a solder ball 152, where the solder ball 152 is positioned on an upper surface of the metal pillar 151, and the metal pillar 151 is electrically connected to the device structure 12. As an example, a material of the metal pillar 151 may include, but is not limited to, copper, tungsten, tin, or an alloy formed by any combination of these metal, etc. A material of the solder ball 152 may include, but is not limited to, copper, tungsten, tin, or an alloy formed by any combination of these metal, etc.

In one embodiment, the surface of the substrate 23 has a pad, the first opening 26 exposes the pad 24, and the metal bump 15 comes in contact with the pad 24. In some embodiments, the solder ball 152 comes in contact with the pad 24. There are a plurality of metal bumps 15 and a plurality of pads 24, and the plurality of pads 24 and the plurality of metal bumps 15 are arranged in one-to-one correspondence.

In one embodiment, a thickness of the second non-conductive layer 22 is less than or equal to that of the solder mask layer 25. After the semiconductor chip 10 is flip-chip bonded on the substrate 23 subsequently, the second non-conductive layer 22 whose thickness is less than or equal to that of the solder mask layer 25 may fill up the first opening 26, while overflow of the material of the second non-conductive layer is reduced.

In one embodiment, a material of the solder mask layer 25 includes a solder mask.

In one embodiment, the package structure further includes a molding layer 27, where the molding layer 27 wraps the semiconductor chip 10, the first non-conductive layer 21, and the second non-conductive layer 22. A side wall of the first dielectric layer 13 and a side wall of the second dielectric layer 14 are completely covered by the first non-conductive layer 21 without coming into direct contact with the molding layer 27, and thus there is no reliability problem caused by an excessive difference between expansion coefficients.

As an example, a material of the molding layer 27 may include, but is not limited to, any one of an epoxy molding compound (EMC), polyimide, silica gel, a polymer-based material and a resin-based material, or any combination thereof, to enhance bonding strength between the semiconductor chip 10 and the substrate 23, improve stability of the package structure, and protect the semiconductor chip 10.

It is to be noted that the above embodiments are intended for purposes of illustration only and are not intended to limit the present disclosure.

It should be understood that unless expressly stated herein, the execution of these steps is not strictly limited in sequence, and these steps may be performed in other orders. Moreover, at least some of the steps may include a plurality of sub-steps or a plurality of stages, which are not necessarily performed at the same moment, but may be executed at different moments, and the order of execution of these sub-steps or stages is not necessarily performed sequentially, but may be performed alternately or alternately with at least a portion of the sub-steps or stages of other steps or other steps.

The embodiments in the specification are described in a progressive manner. Each embodiment is focused on difference from other embodiments. And cross reference is available for identical or similar parts among different embodiments.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

What is claimed is:

1. A package structure, comprising:
    a semiconductor chip;
    a first non-conductive layer covering a front surface of the semiconductor chip and part of a side wall of the semiconductor chip;
    a second non-conductive layer positioned on an upper surface of the first non-conductive layer and covering at least part of a side wall of the first non-conductive layer, wherein a melt viscosity of the first non-conductive layer is greater than a melt viscosity of the second non-conductive layer;
    a substrate; and
    a solder mask layer positioned on a surface of the substrate, a first opening being provided in the solder mask layer;
    wherein the semiconductor chip is flip-chip bonded on the substrate, a surface of the second non-conductive layer away from the first non-conductive layer and a surface of the solder mask layer away from the substrate are bonding surfaces; and the second non-conductive layer fills up the first opening without voids;
    wherein the semiconductor chip comprises a chip body, a first dielectric layer, a second dielectric layer, and a metal bump; the chip body, the first dielectric layer, and the second dielectric layer are stacked in sequence; the first non-conductive layer is positioned on a surface of the second dielectric layer;
    wherein a side wall of the first dielectric layer and a side wall of the second dielectric layer are covered by the first non-conductive layer.

2. The package structure according to claim 1, wherein the melt viscosity of the first non-conductive layer is 2,000 Pa·s to 3,000 Pa·s, and the melt viscosity of the second non-conductive layer is less than or equal to 1,000 Pa·s.

3. The package structure according to claim 1, wherein a device structure is formed on a front surface of the chip body, a second opening being provided in the first dielectric layer and the second dielectric layer, and the second opening exposing the device structure; the metal bump is electrically connected to the device structure.

4. The package structure according to claim 3, wherein the metal bump comprises a metal pillar and a solder ball, the solder ball being positioned on a surface of the metal pillar, and the metal pillar being connected to the device structure.

5. The package structure according to claim 3, wherein a pad is arranged on the surface of the substrate, the first opening exposing the pad, and the metal bump coming into contact with the pad.

6. The package structure according to claim 5, wherein there are a plurality of metal bumps and a plurality of pads, and the plurality of pads and the plurality of metal bumps are arranged in one-to-one correspondence.

7. The package structure according to claim 1, wherein a thickness of the second non-conductive layer is less than or equal to a thickness of the solder mask layer.

8. The package structure according to claim 1, wherein a material of the solder mask layer comprises a solder mask.

9. The package structure according to claim 1, wherein the package structure comprises a molding layer, the molding layer wraps the semiconductor chip, the first non-conductive layer and the second non-conductive layer.

10. A method for fabricating a package structure, comprising:
providing a semiconductor chip;
forming a first non-conductive layer on a front surface of the semiconductor chip;
forming a second non-conductive layer on an upper surface of the first non-conductive layer, wherein a melt viscosity of the first non-conductive layer is greater than a melt viscosity of the second non-conductive layer;
providing a substrate, wherein a solder mask layer is formed on a surface of the substrate, and a first opening is formed in the solder mask layer; and
flip-chip bonding the semiconductor chip on the substrate, wherein a surface of the second non-conductive layer away from the first non-conductive layer and a surface of the solder mask layer away from the substrate are bonding surfaces; and the second non-conductive layer fills up the first opening without voids;
wherein the semiconductor chip comprises a chip body, a first dielectric layer, a second dielectric layer, and a metal bump; the chip body, the first dielectric layer, and the second dielectric layer are stacked in sequence; the first non-conductive layer is positioned on a surface of the second dielectric layer;
wherein a side wall of the first dielectric layer and a side wall of the second dielectric layer are covered by the first non-conductive layer.

11. The method for fabricating the package structure according to claim 10, wherein the melt viscosity of the first non-conductive layer is 2,000 Pa·s to 3,000 Pa·s, and the melt viscosity of the second non-conductive layer is less than or equal to 1,000 Pa·s.

12. The method for fabricating the package structure according to claim 10, wherein the semiconductor chip is flip-chip bonded on the substrate by means of a thermal compress bonding process.

13. The method for fabricating the package structure according to claim 10, wherein before the flip-chip bonding the semiconductor chip on the substrate, the method further comprising:
preheating the substrate, wherein a preheating temperature is 130° C. to 200° C.

14. The method for fabricating the package structure according to claim 10, wherein a pad is formed on a surface of the substrate, and the first opening exposes the pad; and the providing the substrate comprises:
forming a pad on the surface of the substrate;
forming a solder mask material layer on the surface of the substrate and on the pad; and
patterning the solder mask material layer, and removing part of the solder mask material layer, to obtain the solder mask layer, wherein a region corresponding to the removed part of the solder mask material layer is the first opening.

15. The method for fabricating the package structure according to claim 14, wherein the part of the solder mask material layer positioned on the surface of the substrate is removed by means of a wet etching process.

16. The method for fabricating the package structure according to claim 10, wherein a thickness of the second non-conductive layer is less than or equal to a thickness of the solder mask layer.

\* \* \* \* \*